(12) United States Patent
Guo

(10) Patent No.: US 12,299,244 B2
(45) Date of Patent: May 13, 2025

(54) TOUCH SCREEN PANEL AND ELECTRONIC DEVICE

(71) Applicant: Honor Device Co., Ltd., Shenzhen (CN)

(72) Inventor: Dawei Guo, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/035,371

(22) PCT Filed: Dec. 8, 2022

(86) PCT No.: PCT/CN2022/137515
§ 371 (c)(1),
(2) Date: May 4, 2023

(87) PCT Pub. No.: WO2023/169018
PCT Pub. Date: Sep. 14, 2023

(65) Prior Publication Data
US 2024/0345689 A1 Oct. 17, 2024

(30) Foreign Application Priority Data
Mar. 11, 2022 (CN) .......................... 202210243353.9

(51) Int. Cl.
*G06F 3/044* (2006.01)
*G06F 3/041* (2006.01)

(52) U.S. Cl.
CPC .......... *G06F 3/0446* (2019.05); *G06F 3/0412* (2013.01); *G06F 2203/04111* (2013.01)

(58) Field of Classification Search
None
See application file for complete search history.

(56) References Cited

U.S. PATENT DOCUMENTS 9,529,482 B2  12/2016 Liu et al.
11,086,439 B2  8/2021 Ding et al.
(Continued)

FOREIGN PATENT DOCUMENTS

CN  102945106 A  2/2013
CN  103049157 A  4/2013
(Continued)

*Primary Examiner* — Carl Adams
(74) *Attorney, Agent, or Firm* — Leydig, Voit & Mayer, Ltd.

(57) ABSTRACT

A touch screen panel and an electronic device. A touch integrated circuit layer in the touch screen panel includes a first insulating layer, a first metal layer, a second insulating layer, a second metal layer, and an overlay layer that are stacked. The first metal layer is located between the first insulating layer and the second insulating layer, the second metal layer is located between the second insulating layer and the overlay layer, and the first insulating layer is located between the substrate layer and the first metal layer. The first metal layer and the second metal layer jointly form a touch functional layer, and the touch functional layer at least includes at least one driving electrode unit and a plurality of sensing electrode units. The at least one driving electrode unit is electrically insulated from the plurality of sensing electrode units, and each sensing electrode unit is serrated.

20 Claims, 12 Drawing Sheets

(56) References Cited

U.S. PATENT DOCUMENTS

| | | |
|---|---|---|
| 2016/0188029 A1 | 6/2016 | Liu et al. |
| 2017/0344162 A1 | 11/2017 | Lee et al. |
| 2019/0171318 A1 | 6/2019 | Ryu et al. |
| 2020/0192525 A1 | 6/2020 | Li |
| 2021/0223910 A1 | 7/2021 | Yang et al. |
| 2021/0320153 A1 | 10/2021 | Li |
| 2021/0357076 A1* | 11/2021 | Zheng .................. G06F 3/0446 |
| 2022/0197439 A1* | 6/2022 | He ........................ G06F 3/0446 |

FOREIGN PATENT DOCUMENTS

| | | |
|---|---|---|
| CN | 103218097 A | 7/2013 |
| CN | 203746028 U | 7/2014 |
| CN | 109213369 A | 1/2019 |
| CN | 105930019 B | 4/2019 |
| CN | 110034168 A | 7/2019 |
| CN | 110597418 A | 12/2019 |

\* cited by examiner

TOUCH SCREEN PANEL AND ELECTRONIC DEVICE

CROSS-REFERENCE TO RELATED APPLICATIONS

This application is a national stage of International Application No. PCT/CN2022/137515, filed on Dec. 8, 2022, which claims priority to Chinese Patent Application No. 202210243353.9, filed on Mar. 11, 2022. The disclosures of both of the aforementioned applications are hereby incorporated by reference in their entireties.

TECHNICAL FIELD

Embodiments of this application relate to the field of touch technologies, and in particular, to a touch screen panel and an electronic device.

BACKGROUND

With continuous development of communication technologies, touch screen panels (TSPs) already gradually spread throughout people's lives. Currently, touch screen panels may be classified, based on operating principles, into resistive touch screen panels, capacitive touch screen panels, infrared touch screen panels, surface acoustic wave-based touch screen panels, electromagnetic touch screen panels, dispersive signal technology-based touch screen panels, and frustrated total internal reflection optical sensing touch screen panels. The capacitive touch screen panel is widely sought after by the industry because of advantages such as a unique touch principle, high sensitivity, a long service life, and high light transmittance of the capacitive touch screen panel.

In a related technology, an IC (integrated circuit) pattern commonly used on a capacitive touch screen panel is usually a diamond-like sensor pattern. Specifically, in a single touch Pitch (PT*PR) (where PT is short for Pitch Transmit, and PR is short for Pitch Receive), one TX (Transmit, driving channel) corresponds to two RXs (Receive, receive channels). The two triangular receive channels are disposed opposite to each other, and a bridge is connected between the two receive channels to form the diamond-like sensor pattern.

However, in the foregoing solution, a generation signal-to-noise ratio (SNR) of the capacitive touch screen panel is low, a touch failure easily occurs due to a low temperature, and linearity of an active pen is poor.

SUMMARY

Embodiments of this application provide a touch screen panel and an electronic device, to improve a touch failure problem caused by a low temperature, improve a signal quantity and signal uniformity, and improve a linearity effect of an active pen, thereby improving use feeling of a user to a specific extent.

According to a first aspect, an embodiment of this application provides a touch screen panel. The touch screen panel includes at least a substrate layer and a touch integrated circuit layer located above the substrate layer. The touch integrated circuit layer includes a first insulating layer, a first metal layer, a second insulating layer, a second metal layer, and an overlay layer that are stacked. The first metal layer is located between the first insulating layer and the second insulating layer, the second metal layer is located between the second insulating layer and the overlay layer, and the first insulating layer is located between the substrate layer and the first metal layer. The first metal layer and the second metal layer jointly form a touch functional layer, and the touch functional layer at least includes at least one driving electrode unit and a plurality of sensing electrode units. The at least one driving electrode unit is electrically insulated from the plurality of sensing electrode units, and each sensing electrode unit is serrated.

In the touch screen panel provided in this embodiment of this application, the substrate layer and the touch integrated circuit layer are disposed on the touch screen panel, and the touch integrated circuit layer is located above the substrate layer. The touch integrated circuit layer includes the first insulating layer, the first metal layer, the second insulating layer, the second metal layer, and the overlay layer that are sequentially stacked from bottom to top. The first metal layer and the second metal layer jointly form the touch functional layer, and the touch functional layer at least includes the at least one driving electrode unit and the plurality of sensing electrode units. The at least one driving electrode unit is electrically insulated from the plurality of sensing electrode units, and each sensing electrode unit is serrated. Compared with a diamond-like sensing electrode unit in the conventional technology, in this embodiment of this application, the sensing electrode unit in the touch functional layer is designed to be serrated, to improve a touch failure problem caused by a low temperature, improve a signal quantity and signal uniformity, and improve a linearity effect of an active pen, thereby improving use feeling of a user to a specific extent.

In a possible implementation, the substrate layer includes a pixel definition layer and a plurality of light sources located on the pixel definition layer; the touch functional layer further includes metal wires; and the metal wires are distributed among the plurality of light sources to form metal grids, to isolate each light source from remaining light sources.

In this way, it can be ensured that the metal wires are designed at locations other than the light sources on the pixel definition layer, and the metal wires are connected to each other to form the metal grids, to avoid interference between the metal wires and the light sources.

In a possible implementation, a first notch is disposed on the second insulating layer, and the first metal layer and the second metal layer are connected through the first notch. The first notch is disposed on the second insulating layer to ensure that the first metal layer and the second metal layer that are located on two sides of the second insulating layer are connected through the first notch, to ensure electrical conduction and signal transmission between the first metal layer and the second metal layer. In addition, the first notch is disposed on the second insulating layer to further implement an effect of reducing an impedance load of the touch integrated circuit layer.

In a possible implementation, a partial area of the overlay layer extends toward an inside of the second metal layer to form an insulating extension layer; and a projection area of the insulating extension layer on the first metal layer is located in a projection area of the first notch on the first metal layer. In this way, it can be ensured that the insulating extension layer formed by extending the overlay layer toward the inside of the second metal layer is located in the first notch on the second insulating layer.

In a possible implementation, materials used for the first insulating layer and the second insulating layer are organic materials; or materials used for the first insulating layer and the second insulating layer are inorganic materials.

When the touch integrated circuit layer is manufactured, hardness of an inorganic material is greater than hardness of an organic material. If the materials used for the first insulating layer and the second insulating layer are inorganic materials, thicknesses of the first insulating layer and the second insulating layer are designed to be relatively thin. If the materials used for the first insulating layer and the second insulating layer are organic materials, thicknesses of the first insulating layer and the second insulating layer are designed to be relatively thick. Regardless of whether the first insulating layer and the second insulating layer are thin or thick, the first notch may be disposed on the second insulating layer between the first metal layer and the second metal layer, to reduce the impedance load of the touch integrated circuit layer.

In a possible implementation, the second metal layer includes a plurality of touch pixels; each touch pixel includes the driving electrode unit, and a first sensing electrode unit group and a second sensing electrode unit group that are separately electrically insulated from the driving electrode unit; the first sensing electrode unit group includes at least one sensing electrode unit, and the second sensing electrode unit group includes at least one sensing electrode unit; the at least one sensing electrode unit in the first sensing electrode unit group is spaced from and distributed opposite to the at least one sensing electrode unit in the second sensing electrode unit group in a first direction; and each first sensing electrode unit is connected to one second sensing electrode unit opposite to the first sensing electrode unit in the first direction.

When the second metal layer is used as the plurality of touch pixels, the driving electrode unit, the first sensing electrode unit group, and the second sensing electrode unit group are all located at a same layer. The at least one sensing electrode unit in the first sensing electrode unit group and the at least one sensing electrode unit in the second sensing electrode unit group are in a one-to-one correspondence and are connected to each other. In this way, at least one subchannel can be formed between the first sensing electrode unit group and the second sensing electrode unit group.

In a possible implementation, the first sensing electrode unit group includes three spaced sensing electrode units arranged in a second direction, and the second sensing electrode unit group includes three spaced sensing electrode units arranged in the second direction; the three sensing electrode units in the first sensing electrode unit group are spaced from and distributed opposite to the three sensing electrode units in the second sensing electrode unit group in the first direction; each first sensing electrode unit is connected to one second sensing electrode unit opposite to the first sensing electrode unit in the first direction; and the second direction is perpendicular to the first direction.

The driving electrode unit, the first sensing electrode unit group, and the second sensing electrode unit group are all located at a same layer. The three sensing electrode units in the first sensing electrode unit group and the three sensing electrode units in the second sensing electrode unit group are in a one-to-one correspondence and are connected to each other. In this way, three subchannels can be formed between the first sensing electrode unit group and the second sensing electrode unit group, and the three subchannels are connected to a same signal source, to ensure that a receive end channel opposite to each driving electrode unit is formed by three subchannels.

In a possible implementation, the touch functional layer further includes a plurality of bridges; the sensing electrode unit in each first sensing electrode unit group is electrically connected to the sensing electrode unit in the second sensing electrode unit group by using the bridge; and the first metal layer is used as the bridge.

The bridge can separate the first sensing electrode unit group and the second sensing electrode unit group as an upper part and a lower part, and the first sensing electrode unit group and the second sensing electrode unit group implement signal conduction by using the bridge.

In a possible implementation, the sensing electrode unit in each first sensing electrode unit group is electrically connected to the sensing electrode unit in the second sensing electrode unit group by using two bridges. When a quantity of bridges is two, an impedance and a connection signal quantity can reach an optimal equilibrium state.

In a possible implementation, materials used for the first insulating layer and the second insulating layer are organic materials. When the touch integrated circuit layer is manufactured, hardness of an inorganic material is greater than hardness of an organic material. If the materials used for the first insulating layer and the second insulating layer are organic materials, thicknesses of the first insulating layer and the second insulating layer are designed to be thick. In this case, an impedance load of the touch integrated circuit layer is small, and the first notch does not need to be disposed on the second insulating layer between the first metal layer and the second metal layer.

In a possible implementation, the touch functional layer includes a plurality of touch pixels; each touch pixel includes the driving electrode unit, and a first sensing electrode unit group and a second sensing electrode unit group that are separately electrically insulated from the driving electrode unit; the first sensing electrode unit group includes at least one sensing electrode unit, and the second sensing electrode unit group includes at least one sensing electrode unit; the at least one sensing electrode unit in the first sensing electrode unit group is spaced from and distributed opposite to the at least one sensing electrode unit in the second sensing electrode unit group in a first direction; each first sensing electrode unit is connected to one second sensing electrode unit opposite to the first sensing electrode unit in the first direction; and the first metal layer is used as the driving electrode unit, and the second metal layer is used as the sensing electrode unit.

When the first metal layer is used as the driving electrode unit and the second metal layer is used as the sensing electrode unit, the driving electrode unit is located at one layer, the first sensing electrode unit group and the second sensing electrode unit group are located at another layer, and the at least one sensing electrode unit in the first sensing electrode unit group and the at least one sensing electrode unit in the second sensing electrode unit group are in a one-to-one correspondence and are connected to each other. In this way, at least one subchannel can be formed between the first sensing electrode unit group and the second sensing electrode unit group.

In a possible implementation, the first sensing electrode unit group includes three spaced sensing electrode units arranged in a second direction, and the second sensing electrode unit group includes three spaced sensing electrode units arranged in the second direction; the three sensing electrode units in the first sensing electrode unit group are spaced from and distributed opposite to the three sensing electrode units in the second sensing electrode unit group in the first direction; each first sensing electrode unit is connected to one second sensing electrode unit opposite to the first sensing electrode unit in the first direction; and the second direction is perpendicular to the first direction.

The driving electrode unit is located at one layer, the first sensing electrode unit group and the second sensing electrode unit group are located at another layer, and the three sensing electrode units in the first sensing electrode unit group and the three sensing electrode units in the second sensing electrode unit group are in a one-to-one correspondence and are connected to each other. In this way, three subchannels can be formed between the first sensing electrode unit group and the second sensing electrode unit group, and the three subchannels are connected to a same signal source, to ensure that a receive end channel opposite to each driving electrode unit is formed by three subchannels.

In a possible implementation, the sensing electrode unit in each first sensing electrode unit group is in direct electrical contact with the sensing electrode unit in the second sensing electrode unit group. Because the first notch does not need to be disposed on the second insulating layer between the first metal layer and the second metal layer to implement a via hole connection, the first sensing electrode unit group and the second sensing electrode unit group can implement an electrical connection and signal conduction through direct electrical contact.

In a possible implementation, each sensing electrode unit includes a first body part and a plurality of first serrated parts connected to the first body part; a size of each first serrated part in a length direction of the sensing electrode unit is more than four times a pixel pitch of the light sources; a size of each first serrated part in a width direction of the sensing electrode unit is more than four times the pixel pitch of the light sources; and a spacing between two adjacent first serrated parts located on a same side of the first body part is more than four times the pixel pitch of the light sources.

The foregoing values are set to implement an effect of increasing a capacitance value, thereby further ensuring that a touch failure problem caused by a low temperature is improved, a signal quantity and signal uniformity are improved, and a linearity effect of an active pen is improved.

In a possible implementation, the touch integrated circuit layer further has a plurality of second notches, and the second notch is located between two adjacent sensing electrode units in a same sensing electrode unit group. The plurality of second notches are disposed on the touch integrated circuit layer, the second notch is located between two adjacent sensing electrode units in the same sensing electrode unit group, and the second notches are used as virtual wires, and are used as floating lands (DUMMY) to implement signal-free, thereby implementing an effect of reducing a capacitance load and improving a low ground mass benefit.

In a possible implementation, the second notch is serrated; and an extension direction of the second notch is the same as an extension direction of the sensing electrode unit. In this way, a relative area between the second notch and the sensing electrode unit can be increased, so that performance of the second notch as the floating land can be ensured.

In a possible implementation, each second notch includes a second body part and a plurality of second serrated parts connected to the second body part; a size of each second serrated part in a length direction of the second notch is more than two times a pixel pitch of the light sources; a size of each second serrated part in a width direction of the second notch is more than two times the pixel pitch of the light sources; and a spacing between two adjacent second serrated parts located on a same side of the second body part is more than two times the pixel pitch of the light sources.

The foregoing values are set to further ensure the effect of reducing a capacitance load and improving a low ground mass benefit.

In a possible implementation, the overlay layer is an organic overlay layer.

In a possible implementation, the touch screen panel further includes a thin film encapsulation layer; and the thin film encapsulation layer is located between the substrate layer and the touch integrated circuit layer.

According to a second aspect, an embodiment of this application provides an electronic device. The electronic device includes at least any of the foregoing touch screen panels.

In the electronic device provided in this embodiment of this application, the electronic device includes at least the touch screen panel. The substrate layer and the touch integrated circuit layer are disposed on the touch screen panel, and the touch integrated circuit layer is located above the substrate layer. The touch integrated circuit layer includes the first insulating layer, the first metal layer, the second insulating layer, the second metal layer, and the overlay layer that are sequentially stacked from bottom to top. The first metal layer and the second metal layer jointly form the touch functional layer, the touch functional layer at least includes the at least one driving electrode unit and the plurality of sensing electrode units. The at least one driving electrode unit is electrically insulated from the plurality of sensing electrode units, and each sensing electrode unit is serrated. Compared with a diamond-like sensing electrode unit in the conventional technology, in this embodiment of this application, the sensing electrode unit in the touch functional layer is designed to be serrated, to improve a touch failure problem caused by a low temperature, improve a signal quantity and signal uniformity, and improve a linearity effect of an active pen, thereby improving use feeling of a user to a specific extent.

BRIEF DESCRIPTION OF DRAWINGS

FIG. 6 is a schematic diagram in which FIG. 5 is partially enlarged;

FIG. 8 is a schematic diagram in which FIG. 7 is partially enlarged;

FIG. 12 is a schematic diagram in which FIG. 11 is partially enlarged;

FIG. 14 is a schematic diagram in which FIG. 13 is partially enlarged; and

DESCRIPTIONS OF REFERENCE NUMERALS

100—touch screen panel; 110—substrate layer; 111—pixel definition layer;
112—RGB light source; 1121—red light source; 1122—green light source;
1123—blue light source; 120—touch integrated circuit layer; 121—first insulating layer;
122—second insulating layer; 1221—first notch; 123—overlay layer;
1231—insulating extension layer; 124—first metal layer; 125—second metal layer;
130—touch functional layer; 131—metal wire; 132—touch Pitch;
133—driving electrode unit; 134—sensing electrode unit; 1341—first body part;
1342—first serrated part; 134a—first sensing electrode unit group; 134b—second sensing electrode unit group;
135—bridge; 136—second notch; 1361—second body part;
1362—second serrated part; 140—thin film encapsulation layer; L1—pixel pitch of light sources;
D1—first distance; D2—second distance; D3—third distance;
D4—fourth distance; D5—fifth distance; D6—sixth distance;
200—electronic device; 210—display; 211—first opening;
220—middle frame; 221—middle metal plate; 222—metal border;
2221—top border; 2222—bottom border; 2223—left border;
2224—right border; 230—circuit board; 240—battery;
250—rear housing; 251—second opening; 260—front-facing camera module;
270—rear-facing camera module; H1—first direction; and H2—second direction.

DESCRIPTION OF EMBODIMENTS

The terms used in the implementation part of this application are merely intended to explain specific embodiments of this application and are not intended to limit this application. The following describes implementations of the embodiments of this application in detail with reference to the accompanying drawings.

Embodiments of this application provide an electronic device that may include but is not limited to a mobile or fixed terminal having a display, for example, a mobile phone, a tablet computer, a notebook computer, an ultra-mobile personal computer (UMPC), a handheld computer, a walkie-talkie, a netbook, a point of sale (POS) terminal, a personal digital assistant (PDA), a wearable device, a virtual reality device, a wireless USB flash, a Bluetooth speaker/headset, in-vehicle original equipment, an event data recorder, or a security protection device.

Figure 1:
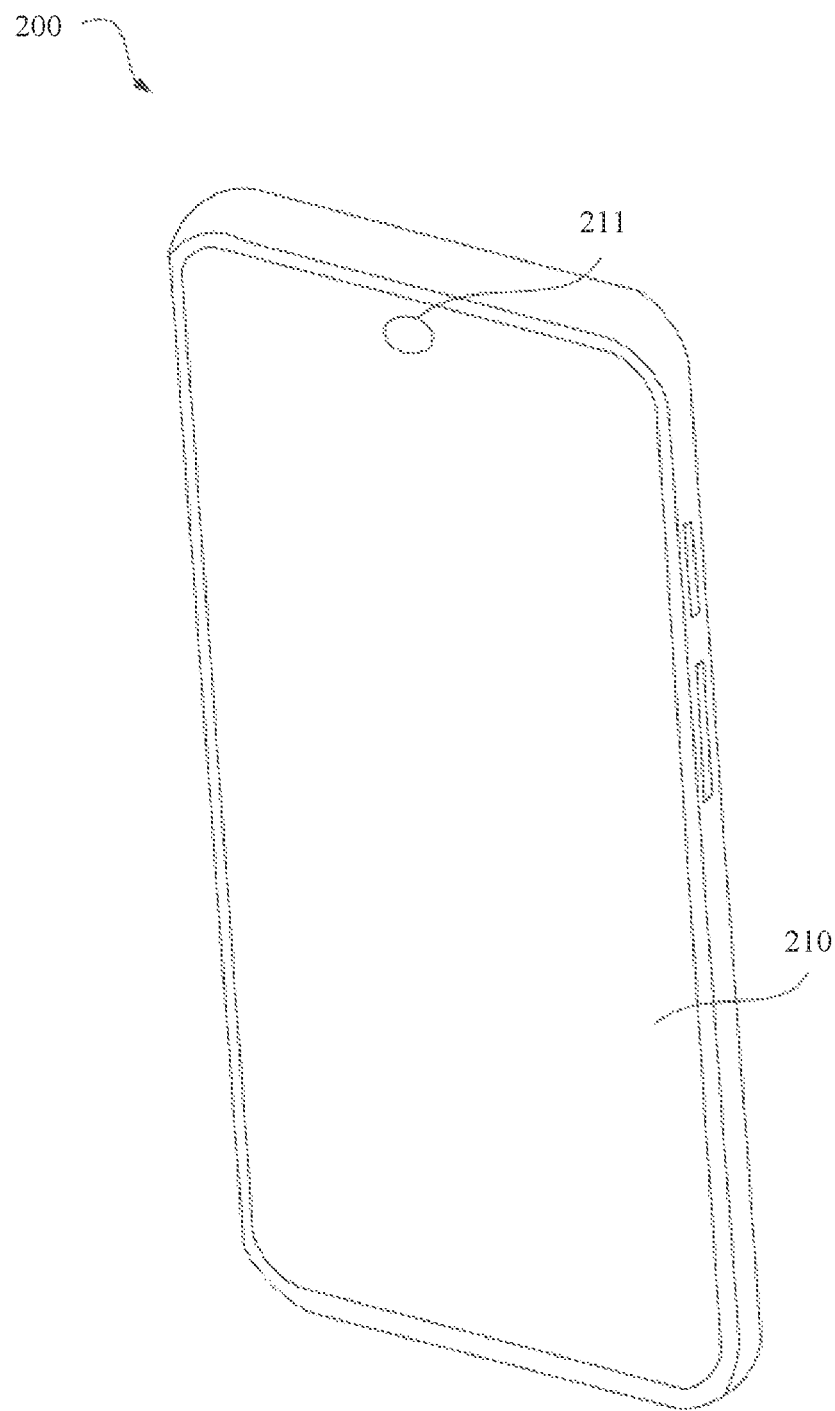
FIG. 1 is a schematic diagram of a structure of an electronic device according to an embodiment of this application.
Figure 2:
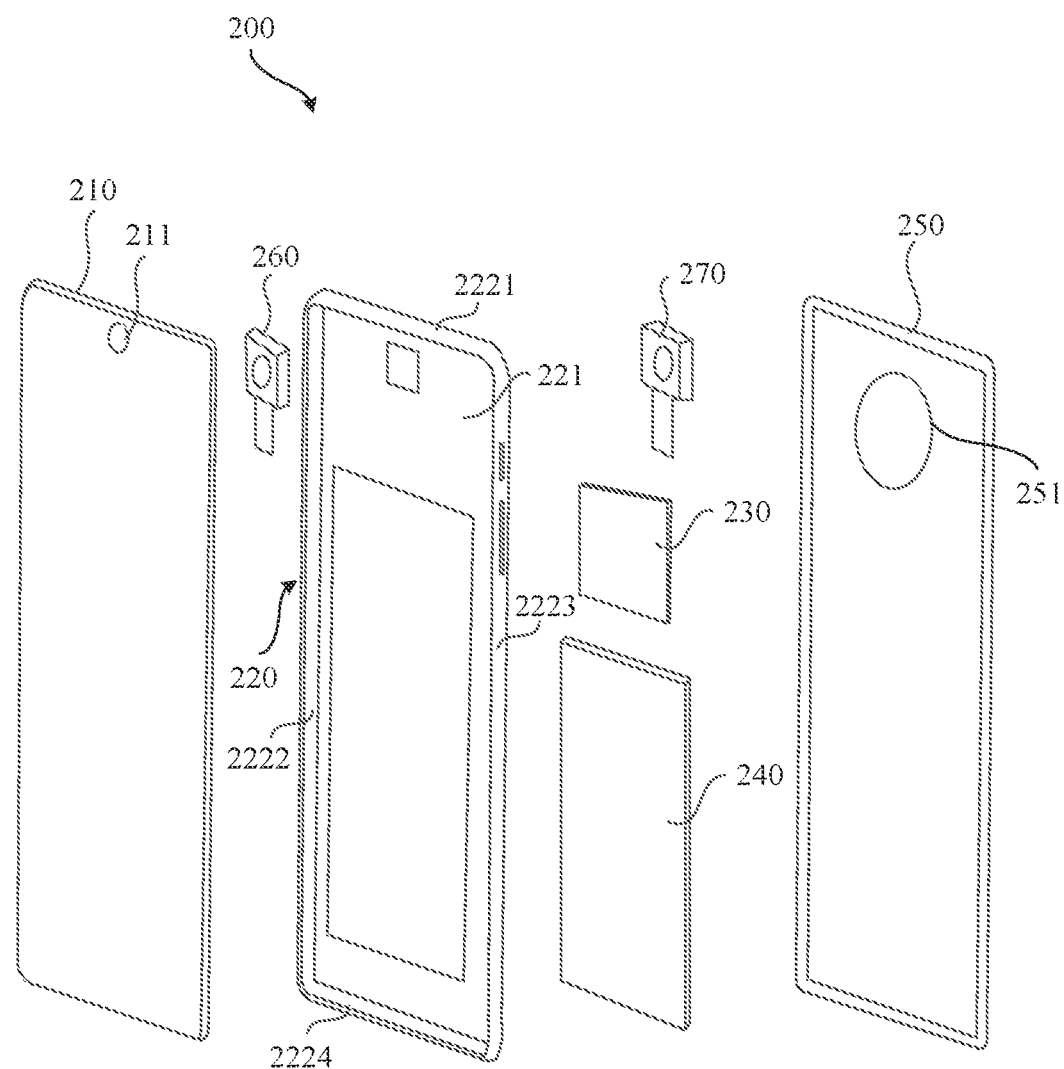
FIG. 2 is an exploded view of FIG. 1.

Refer to FIG. 1 and FIG. 2. In this embodiment of this application, that the electronic device is a mobile phone is used as an example for description. The mobile phone provided in this embodiment of this application may be a curved screen mobile phone or a flat screen mobile phone, and may be a bar-type mobile phone or a foldable screen mobile phone. In this embodiment of this application, a bar-type flat screen mobile phone is used as an example for description. FIG. 1 and FIG. 2 respectively show an integral structure and a split structure of a mobile phone. A display 210 of the mobile phone provided in this embodiment of this application may be a water drop screen, a notch screen, a full screen, or a hole-punch screen (as shown in FIG. 1). For example, a first opening 211 is disposed on the display 210. The following provides description with a hole-punch screen as an example.

Refer to FIG. 2. The mobile phone may include a display 210, a middle frame 220, a rear housing 250, and a battery 240 located between the middle frame 220 and the rear housing 250, where the battery 240 may be disposed on one side that is of the middle frame 220 and that faces the rear housing 250 (as shown in FIG. 2), or the battery 240 may be disposed on one side that is of the middle frame 220 and that faces the display 210. For example, the side that is of the middle frame 220 and that faces the rear housing 250 may have a battery compartment (not shown), and the battery 240 is installed in the battery compartment.

In some other examples, the mobile phone may further include a circuit board 230. The circuit board 230 may be disposed on the middle frame 220. For example, the circuit board 230 may be disposed on the side that is of the middle frame 220 and that faces the rear housing 250 (as shown in FIG. 2), or the circuit board 230 may be disposed on the side that is of the middle frame 220 and that faces the display 210. The display 210 and the rear housing 250 are respectively located on two sides of the middle frame 220.

The battery 240 may be connected to the circuit board 230 by using a power management module and a charging management module. The power management module receives an input of the battery 240 and/or the charging management module, and supplies power to a processor, an internal memory, an external memory, the display 210, camera modules (for example, a front-facing camera module 260 and a rear-facing camera module 270 in FIG. 2), a communication module, and the like. The power management module may be further configured to monitor parameters such as a capacity of the battery 240, a cycle count of the battery 240, and a state of health (leakage or impedance) of the battery 240. In some other embodiments, the power management module may alternatively be disposed in the processor of the circuit board 230. In some other embodiments, the power management module and the charging management module may alternatively be disposed in a same device.

When the mobile phone is a flat screen mobile phone, the display 210 may be an organic light-emitting diode (OLED) display, or may be a liquid crystal display (LCD). When the mobile phone is a curved screen mobile phone, the display 210 may be an OLED display.

Still refer to FIG. 2. The middle frame 220 may include a middle metal plate 221 and a border 222, and the border 222 is disposed around a periphery of the middle metal plate 221. Usually, the border 222 may include a top border 2221, a bottom border 2222, a left border 2223, and a right border 2224, and the top border 2221, the bottom border 2222, the left border 2223, and the right border 2224 enclose to form the border 222 of a square ring structure. A material of the middle metal plate 221 includes but is not limited to an aluminum plate, aluminum alloy, stainless steel, a steel-aluminum composite die-casting plate, titanium alloy, or magnesium alloy. The border 222 may be a metal border, a ceramic border, or a glass border. When the border 222 is a metal border, a material of the metal border includes but is not limited to aluminum alloy, stainless steel, a steel-aluminum composite die-casting plate, or titanium alloy. The middle metal plate 221 may be connected to the border 222 through clamping, welding, bonding, or integral molding, or the middle metal plate 221 may be fixedly connected to the border 222 through injection molding.

Refer to FIG. 2. The top border 2221 is disposed opposite to the bottom border 2222, the left border 2223 is disposed opposite to the right border 2224, the top border 2221 is separately connected to one end of the left border 2223 and one end of the right border 2224 at a rounded corner, and the bottom border 2222 is separately connected to the other end of the left border 2223 and the other end of the right border 2224 at a rounded corner, to jointly form a round-cornered rectangular area. A rear housing ground surface is disposed in the round-cornered rectangular area, and is separately connected to the top border 2221, the bottom border 2222, the left border 2223, and the right border 2224. It may be understood that the rear housing ground surface may be the rear housing 250 of the mobile phone.

The rear housing 250 may be a metal rear housing, a glass rear housing, a plastic rear housing, or a ceramic rear housing. In this embodiment of this application, a material of the rear housing 250 is not limited, and is not limited to the foregoing examples either.

It should be noted that, in some examples, the rear housing 250 of the mobile phone may be connected to the border 222 to form a unibody (Unibody) rear housing. For example, the mobile phone may include the display 210, the middle metal plate 221, and a rear housing. The rear housing may be a unibody (Unibody) rear housing formed by the border 222 and the rear housing 250. In this way, the circuit board 230 and the battery 240 are located in a space enclosed by the middle metal plate 221 and the rear housing.

In addition, in a possible implementation, a second opening 251 may be further disposed on the rear housing 250 as a light-transmitting area of the rear-facing camera module 270. Similarly, the first opening 211 on the display 210 may also be used as a light-transmitting area of the front-facing camera module 260.

Figure 3:
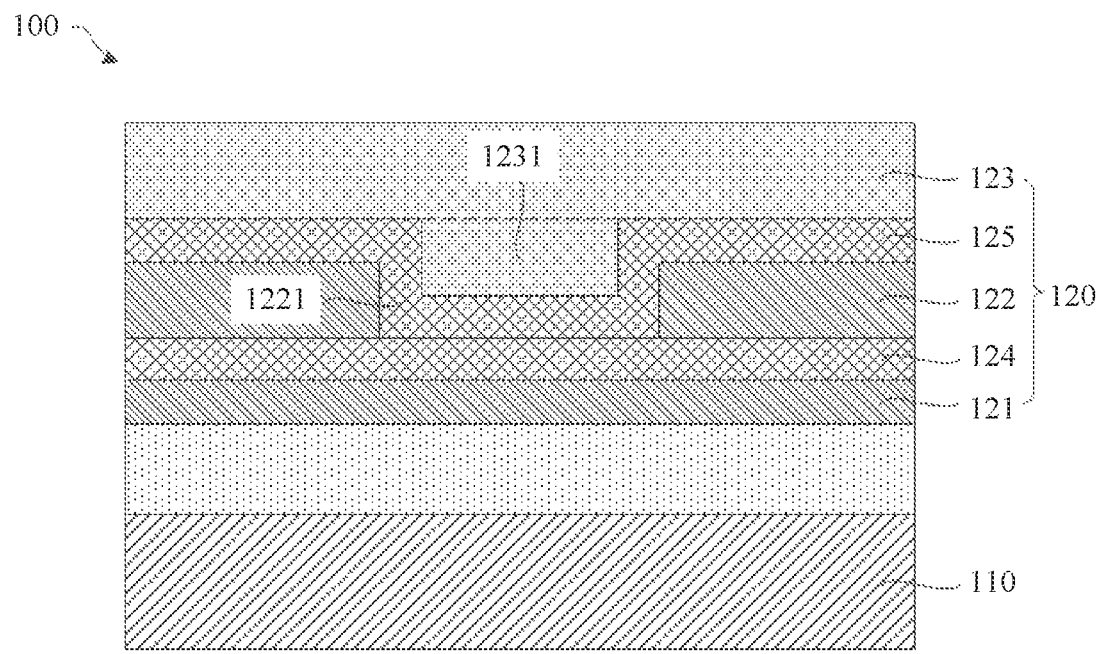
FIG. 3 is a schematic diagram of a cross section of a touch screen panel according to an embodiment of this application.

It should be noted that, in this embodiment of this application, the foregoing electronic device may alternatively be a tablet computer shown in FIG. 3. Specifically, refer to FIG. 3. The tablet computer may include at least a display 210 and a middle frame 220, where the middle frame 220 may include a middle metal plate 221 and a border 222, and the border 222 is disposed around a periphery of the middle metal plate 221.

It may be understood that the structures shown in this embodiment of this application constitute no specific limitation on the electronic device 200. In some other embodiments of embodiments of this application, the electronic device 200 may include more or fewer components than those shown in the figure, may combine some components, may split some components, or may have different component arrangements. The components in the figure may be implemented by hardware, software, or a combination of software and hardware.

In some embodiments, the display 210 may be a touch screen panel (for example, a capacitive touch screen panel). In a related technology, an IC pattern commonly used on a capacitive touch screen panel is usually a diamond-like sensor pattern. Specifically, in a single touch Pitch (PT*PR) (where PT is short for Pitch Transmit, and PR is short for Pitch Receive), one TX (Transmit, driving channel) corresponds to two RXs (Receive, receive channels). The two triangular receive channels are disposed opposite to each other, and a bridge is connected between the two receive channels to form the diamond-like sensor pattern. However, in this solution, because a diamond-like sensor pattern design corresponds to a large cathode capacitance load and a small signal quantity, a generation signal-to-noise ratio (SNR) of the capacitive touch screen panel is low. Consequently, when a finger touches the touch screen panel, a mutual capacitance phenomenon is changed due to a temperature of a hand. This phenomenon has a poorest effect when the signal quantity or signal-to-noise ratio is low. In this case, a touch failure easily occurs due to a low temperature.

In addition, linearity comes from a maximum inter-point offset of a point reported by a touch IC after line drawing. When the signal-to-noise ratio is low, an actual point reporting location offset is also caused. Consequently, a larger offset causes poorer linearity of an active pen.

Based on this, an embodiment of this application provides a new touch screen panel and an electronic device having the touch screen panel. The touch screen panel may be used in an electronic device (for example, a mobile phone or a computer), to resolve the foregoing technical problems.

With reference to specific accompanying drawings, the following uses different embodiments as examples to describe in detail a specific structure of the touch screen panel.

Refer to FIG. 3. An embodiment of this application provides a touch screen panel 100. The touch screen panel 100 may be used in the electronic device 200. Specifically, the touch screen panel 100 may include at least a substrate layer 110 and a touch integrated circuit layer 120, where the touch integrated circuit layer 120 is located above the substrate layer 110.

Still refer to FIG. 3. The touch integrated circuit layer 120 may include a first insulating layer 121, a first metal layer 124, a second insulating layer 122, a second metal layer 125, and an overlay layer 123 that are stacked, where the first metal layer 124 is located between the first insulating layer 121 and the second insulating layer 122, the second metal layer 125 is located between the second insulating layer 122 and the overlay layer 123, and the first insulating layer 121 is located between the substrate layer 110 and the first metal layer 124.

Figure 4:
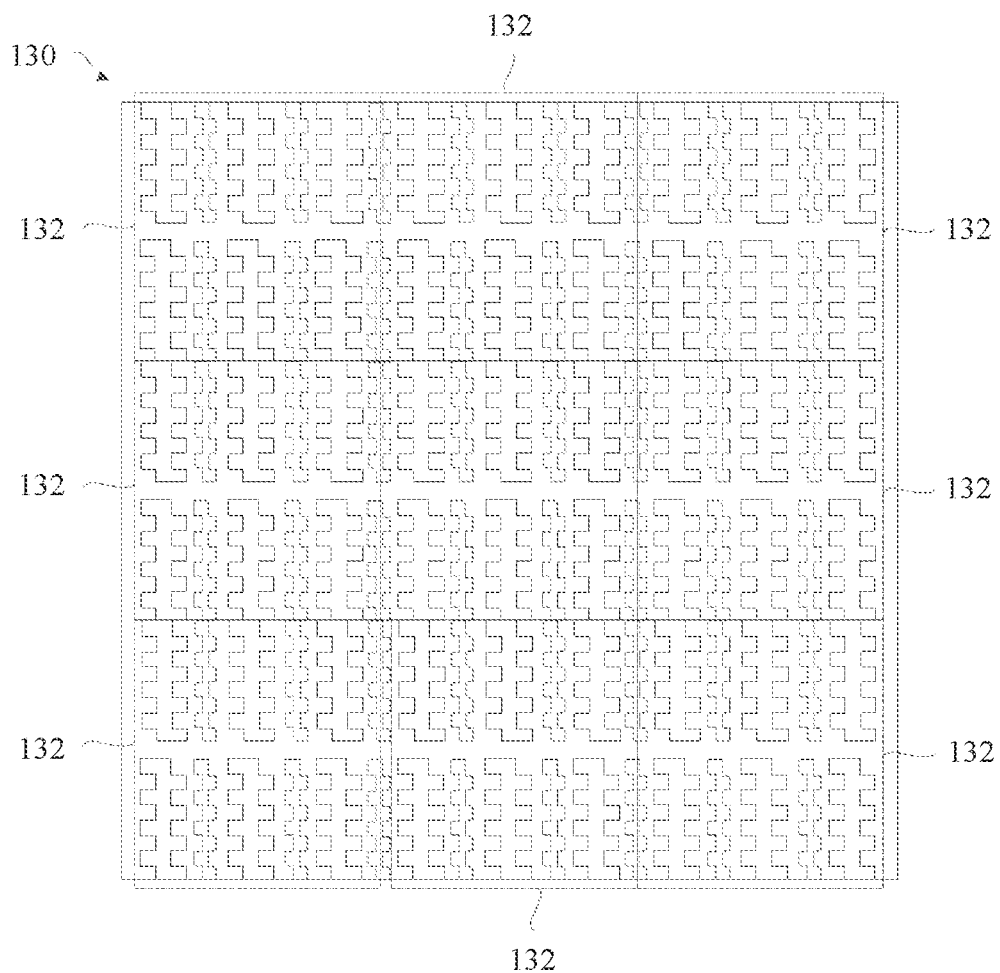
FIG. 4 is a schematic diagram of a microstructure of a touch screen panel according to an embodiment of this application.

In this embodiment of this application, the first metal layer 124 and the second metal layer 125 jointly form a touch functional layer 130 (as shown in FIG. 4). Specifically, refer to FIG. 5. The touch functional layer 130 may at least include at least one driving electrode unit 133 and a plurality of sensing electrode units 134, where the at least one driving electrode unit 133 is electrically insulated from the plurality of sensing electrode units 134, and each sensing electrode unit 134 is serrated.

The substrate layer 110 and the touch integrated circuit layer 120 are disposed, and the touch integrated circuit layer 120 is located above the substrate layer 110. The touch integrated circuit layer 120 may include the first insulating layer 121, the first metal layer 124, the second insulating layer 122, the second metal layer 125, and the overlay layer 123 that are sequentially stacked from bottom to top. The first metal layer 124 and the second metal layer 125 jointly form the touch functional layer 130, the touch functional layer 130 may at least include the at least one driving electrode unit 133 and the plurality of sensing electrode units 134. The at least one driving electrode unit 133 is electrically insulated from the plurality of sensing electrode units 134, and each sensing electrode unit 134 is serrated. The sensing electrode unit 134 in the touch functional layer 130 is designed to be serrated. Compared with a diamond-like sensing electrode unit 134 in the conventional technology, in this embodiment of this application, a diamond-like sensor pattern design corresponds to a small cathode capacitance load and a large signal quantity, so that a generation signal-to-noise ratio (SNR) of a capacitive touch screen panel is increased. In this way, a touch failure problem caused by a low temperature can be improved, and the signal quantity and signal uniformity can be improved. In addition, when the signal-to-noise ratio is high, an actual point reporting location offset can be reduced, and an offset is reduced, thereby improving a linearity effect of an active pen, and improving use feeling of a user to a specific extent.

In this embodiment of this application, a first notch 1221 (as shown in FIG. 3) may be disposed on the second insulating layer 122, and the first metal layer 124 and the second metal layer 125 are connected through the first notch 1221. The first notch 1221 is disposed on the second insulating layer 122 to ensure that the first metal layer 124 and the second metal layer 125 that are located on two sides of the second insulating layer 122 are connected through the first notch 1221, to ensure electrical conduction and signal transmission between the first metal layer 124 and the second metal layer 125.

In addition, the first notch 1221 is disposed on the second insulating layer 122 to further implement an effect of reducing an impedance load of the touch integrated circuit layer 120.

In this embodiment of this application, a partial area of the overlay layer 123 may extend toward an inside of the second metal layer 125 to form an insulating extension layer 1231 (as shown in FIG. 3); and a projection area of the insulating extension layer 1231 on the first metal layer 124 is located in a projection area of the first notch 1221 on the first metal layer 124. In this way, it can be ensured that the insulating extension layer 1231 formed by extending the overlay layer 123 toward the inside of the second metal layer 125 is located in the first notch 1221 on the second insulating layer 122.

In this embodiment of this application, materials used for the first insulating layer 121 and the second insulating layer 122 may be organic materials; or materials used for the first insulating layer 121 and the second insulating layer 122 are inorganic materials (for example, silicon nitride).

When the touch integrated circuit layer 120 is manufactured, hardness of an inorganic material is greater than hardness of an organic material. If the materials used for the first insulating layer 121 and the second insulating layer 122 are inorganic materials, thicknesses of the first insulating layer 121 and the second insulating layer 122 are designed to be relatively thin. If the materials used for the first insulating layer 121 and the second insulating layer 122 are organic materials, thicknesses of the first insulating layer 121 and the second insulating layer 122 are designed to be relatively thick. Regardless of whether the first insulating layer 121 and the second insulating layer 122 are thin or thick, the first notch 1221 may be disposed on the second insulating layer 122 between the first metal layer 124 and the second metal layer 125, to reduce the impedance load of the touch integrated circuit layer 120.

In this embodiment of this application, as shown in FIG. 4, the touch functional layer 130 may include a plurality of touch pixels (Pitch) 132, and the second metal layer 125 is used as the plurality of touch Pitches 132. In other words, the second metal layer 125 may include the plurality of touch Pitches 132. Specifically, refer to FIG. 5. Each touch Pitch 132 may include the driving electrode unit 133, a first sensing electrode unit group 134a, and a second sensing electrode unit group 134b, where the first sensing electrode unit group 134a and the second sensing electrode unit group 134b are separately electrically insulated from the driving electrode unit 133.

The first sensing electrode unit group 134a may include at least one sensing electrode unit 134, the second sensing electrode unit group 134b may include at least one sensing electrode unit 134, and the at least one sensing electrode unit 134 in the first sensing electrode unit group 134a is spaced from and distributed opposite to the at least one sensing electrode unit 134 in the second sensing electrode unit group 134b in a first direction H1. In addition, each sensing electrode unit 134 in the first sensing electrode unit group 134a is connected to one sensing electrode unit 134 that is in the second sensing electrode unit group 134b and that is opposite to the sensing electrode unit 134 in the first sensing electrode unit group 134a in the first direction H1.

Figure 5:
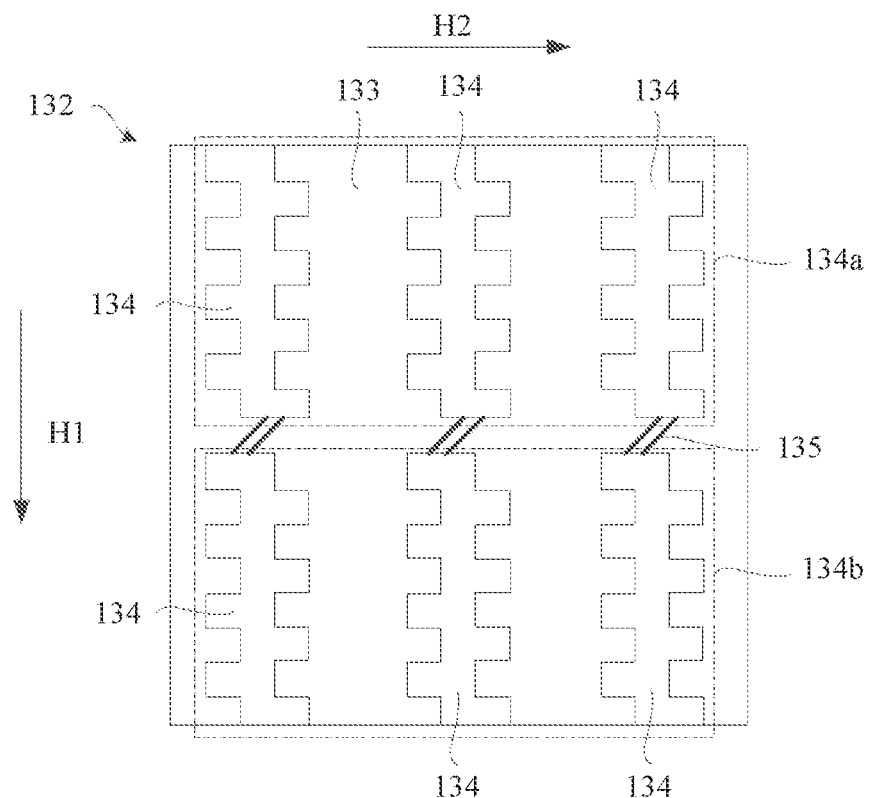
FIG. 5 is a schematic diagram of a structure of a single touch Pitch in a touch screen panel according to an embodiment of this application.

Specifically, refer to FIG. 5. The first sensing electrode unit group 134a may include three spaced sensing electrode units 134 arranged in a second direction H2, the second sensing electrode unit group 134b may include three spaced sensing electrode units 134 arranged in the second direction H2, and the three sensing electrode units 134 in the first sensing electrode unit group 134a are spaced from and distributed opposite to the three sensing electrode units 134 in the second sensing electrode unit group 134b in the first direction H1. In addition, each sensing electrode unit 134 in the first sensing electrode unit group 134a is connected to one sensing electrode unit 134 that is in the second sensing electrode unit group 134b and that is opposite to the sensing electrode unit 134 in the first sensing electrode unit group 134a in the first direction H1.

It should be noted that, in this embodiment of this application, the second direction H2 is perpendicular to the first direction H1.

When the second metal layer 125 is used as the plurality of touch Pitches 132, the driving electrode unit 133, the first sensing electrode unit group 134a, and the second sensing electrode unit group 134b are all located at a same layer. The three sensing electrode units 134 in the first sensing electrode unit group 134a and the three sensing electrode units 134 in the second sensing electrode unit group 134b are in a one-to-one correspondence and are connected to each other. In this way, three subchannels can be formed between the first sensing electrode unit group 134a and the second sensing electrode unit group 134b, and the three subchannels are connected to a same signal source, to ensure that a receive end channel opposite to each driving electrode unit 133 is formed by three subchannels.

Figure 6:
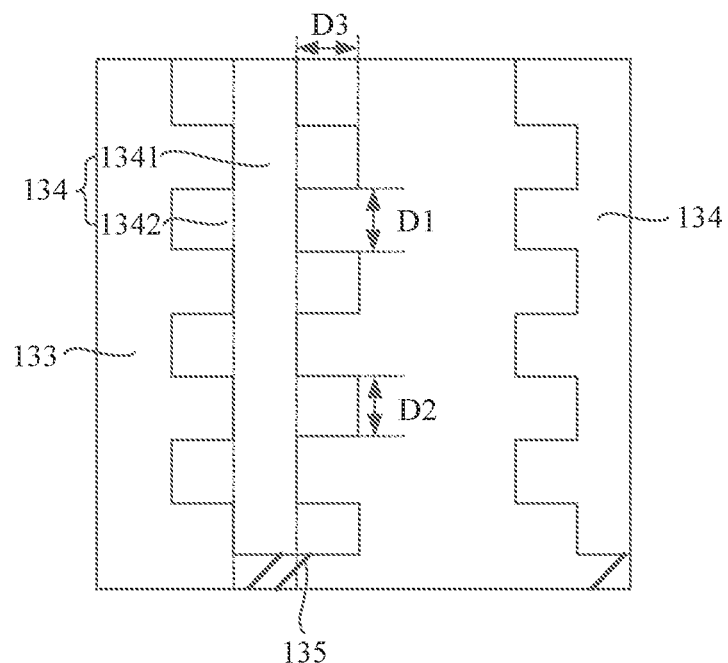

In a possible implementation, the touch functional layer 130 may further include a plurality of bridges 135 (as shown in FIG. 5 or FIG. 6). The sensing electrode unit 134 in each first sensing electrode unit group 134a may be electrically connected to the sensing electrode unit 134 in the second sensing electrode unit group 134b by using the bridge 135, and the first metal layer 124 may be used as the bridge 135.

The bridge 135 can separate the first sensing electrode unit group 134a and the second sensing electrode unit group 134b as an upper part and a lower part, and the first sensing electrode unit group 134a and the second sensing electrode unit group 134b implement signal conduction by using the bridge 135.

In some embodiments, the sensing electrode unit 134 in each first sensing electrode unit group 134a may be electrically connected to the sensing electrode unit 134 in the second sensing electrode unit group 134b by using two bridges 135. When overlap interference occurs between the driving electrode unit 133 and a signal connection between the sensing electrode unit 134 in the first sensing electrode unit group 134a and the sensing electrode unit 134 in the second sensing electrode unit group 134b, a mutual capacitance load is generated through overlap interference. For consideration of an impedance and an invalid capacitance value, a simulation result represents that the impedance and a connection signal quantity can reach an optimal equilibrium state when a quantity of bridges 135 is two.

As shown in FIG. 6, each sensing electrode unit 134 may include a first body part 1341 and a plurality of first serrated parts 1342, where the plurality of first serrated parts 1342 are connected to the first body part 1341.

In addition, a spacing (namely, a first distance D1) between two adjacent first serrated parts 1342 located on a same side of the first body part 1341 may be more than four times a pixel pitch of light sources, a size (namely, a second distance D2) of each first serrated part 1342 in a length direction of the sensing electrode unit 134 may be more than four times the pixel pitch of the light sources, and a size (namely, a third distance D3) of each first serrated part 1342 in a width direction of the sensing electrode unit 134 may be more than four times the pixel pitch of the light sources.

A larger quantity of first serrated parts 1342 indicates a longer length of the sensing electrode unit 134 and larger circumference of the sensing electrode unit 134. In this way, a contact area between the sensing electrode unit 134 and the driving electrode unit 133 is larger. Therefore, the foregoing values are set to implement an effect of increasing a capacitance value, thereby further ensuring that a touch failure problem caused by a low temperature is improved, a signal quantity and signal uniformity are improved, and a linearity effect of an active pen is improved.

Figure 7:
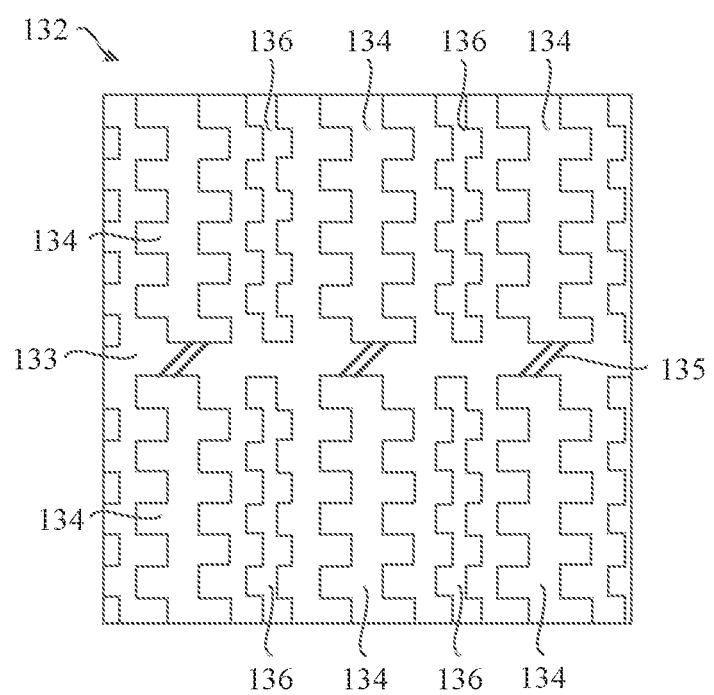
FIG. 7 is a schematic diagram of a structure of a single touch Pitch in a touch screen panel according to an embodiment of this application.
Figure 8:
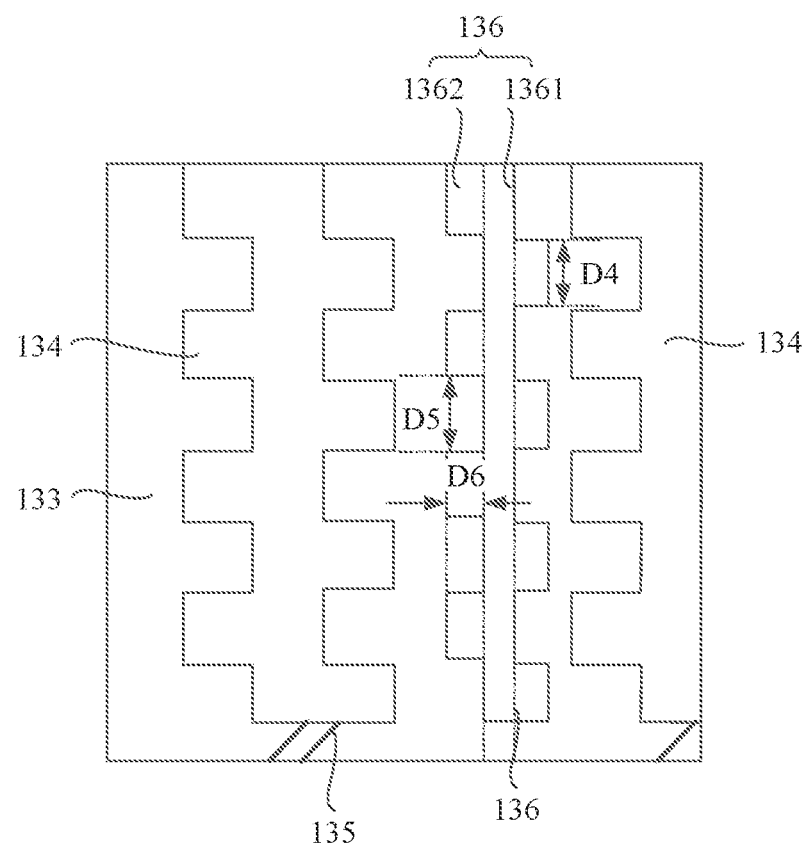

In addition, in some embodiments, refer to FIG. 7 and FIG. 8. The touch integrated circuit layer 120 may further have a plurality of second notches 136, and the second notch 136 is located between two adjacent sensing electrode units 134 in a same sensing electrode unit 134 group. The plurality of second notches 136 are disposed on the touch integrated circuit layer 120, the second notch 136 is located between two adjacent sensing electrode units 134 in the same sensing electrode unit 134 group, and the second notches 136 are used as virtual wires, and are used as floating lands (DUMMY) to implement signal-free, thereby implementing an effect of reducing a capacitance load and improving a low ground mass (LGM) benefit.

For example, the second notch 136 may be serrated, and an extension direction of the second notch 136 may be the same as an extension direction of the sensing electrode unit 134. In this way, a relative area between the second notch 136 and the sensing electrode unit 134 can be increased, so that performance of the second notch 136 as the floating land can be ensured.

As shown in FIG. 8, each second notch 136 may include a second body part 1361 and a plurality of second serrated parts 1362, where the plurality of second serrated parts 1362 are connected to the second body part 1361.

In addition, a size (namely, a fourth distance D4) of each second serrated part 1362 in a length direction of the second notch 136 may be more than two times a pixel pitch of light sources, a spacing (namely, a fifth distance D5) between two adjacent second serrated parts 1362 located on a same side of the second body part 1361 may be more than two times the pixel pitch of the light sources, and a size (namely, a sixth distance D6) of each second serrated part 1362 in a width direction of the second notch 136 may be more than two times the pixel pitch of the light sources. The foregoing values are set to further ensure the effect of reducing a capacitance load and improving a low ground mass benefit.

It should be noted that, in this embodiment of this application, the overlay layer 123 may be an organic overcoating.

In addition, in this embodiment of this application, the touch screen panel 100 may further include a thin film encapsulation (TFE) layer, where the thin film encapsulation layer 140 may be located between the substrate layer 110 and the touch integrated circuit layer 120.

Figure 9:
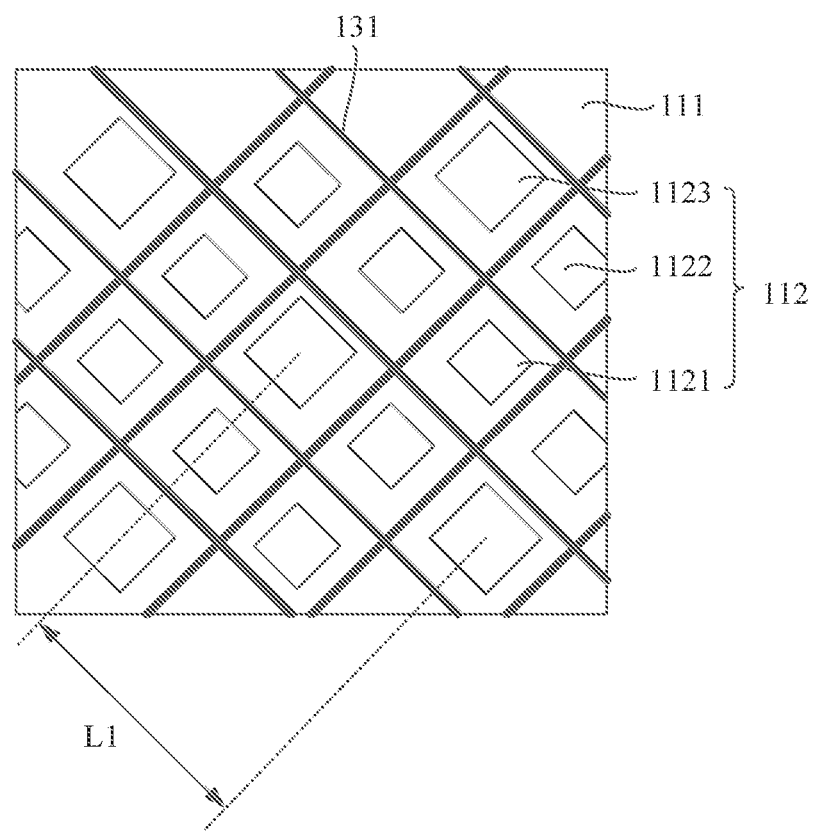
FIG. 9 is a schematic diagram of a microstructure at any point in FIG. 5.

As shown in FIG. 9, in this embodiment of this application, the substrate layer 110 may include a pixel definition layer 111 and a plurality of light sources, where the plurality of light sources are located on the pixel definition layer 111.

It may be understood that the light sources each may be a red light source 1121, a green light source 1122, or a blue light source 1123, and the red light source 1121, the green light source 1122, and the blue light source 1123 jointly form an RGB light source 112.

It should be noted that a pixel pitch L1 of the light sources is a spacing between two light sources of a same color. For example, in FIG. 9, the pixel pitch L1 of the light sources may be a spacing between two red light sources 1121.

The touch functional layer 130 may further include metal wires 131, and the metal wires 131 are distributed among the plurality of light sources to form metal grids, to isolate each light source from remaining light sources. In this way, it can be ensured that the metal wires 131 are designed at locations other than the light sources on the pixel definition layer 111, and the metal wires 131 are connected to each other to form the metal grids, to avoid interference between the metal wires 131 and the light sources.

Embodiment 2

An embodiment of this application further provides a touch screen panel 100 of another structure. A difference lies in that materials used for materials used for the first insulating layer 121 and the second insulating layer 122 in Embodiment 2 are different from those in Embodiment 2.

Figure 10:
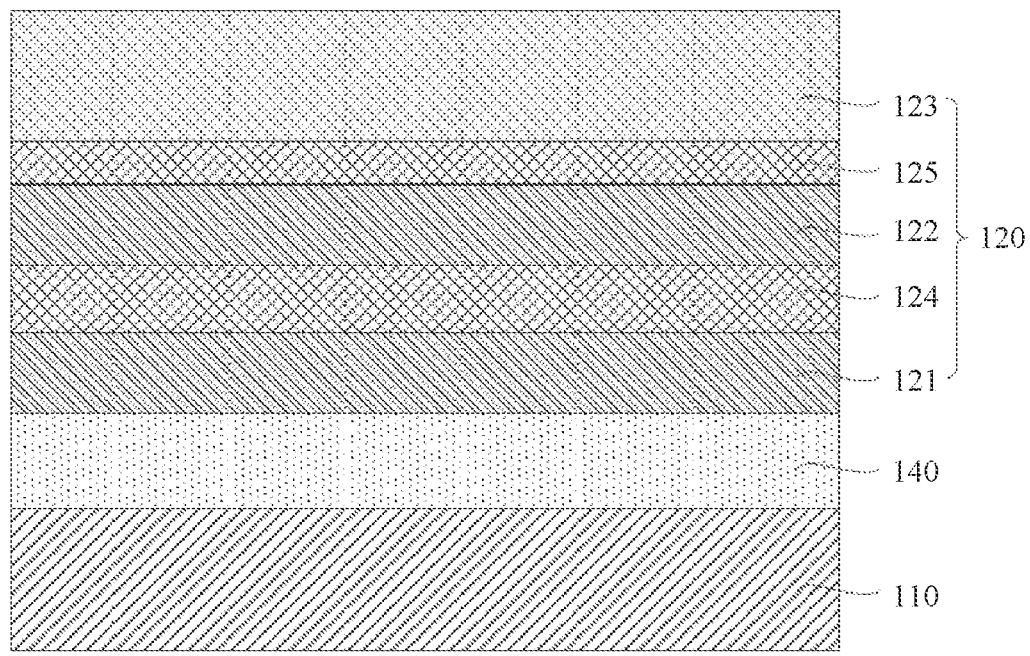
FIG. 10 is a schematic diagram of a cross section of a touch screen panel according to an embodiment of this application.

In this embodiment of this application, the materials used for the first insulating layer 121 and the second insulating layer 122 may be organic materials. When the touch integrated circuit layer 120 is manufactured, hardness of an inorganic material is greater than hardness of an organic material. If the materials used for the first insulating layer 121 and the second insulating layer 122 are organic materials, thicknesses of the first insulating layer 121 and the second insulating layer 122 are designed to be thick. In this case, an impedance load of the touch integrated circuit layer 120 is small, and the first notch 1221 does not need to be disposed on the second insulating layer 122 between the first metal layer 124 and the second metal layer 125 (as shown in FIG. 10).

Figure 11:
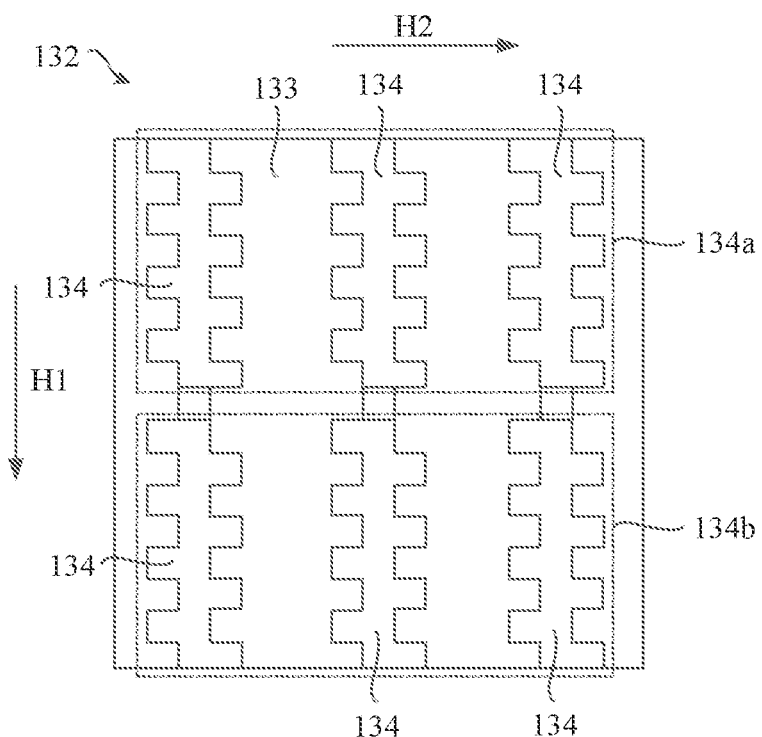
FIG. 11 is a schematic diagram of a structure of a single touch Pitch in a touch screen panel according to an embodiment of this application.

In this embodiment of this application, the touch functional layer 130 may include a plurality of touch Pitches 132. Specifically, refer to FIG. 11. Each touch Pitch 132 may include the driving electrode unit 133, a first sensing electrode unit group 134a, and a second sensing electrode unit group 134b, where the first sensing electrode unit group 134a and the second sensing electrode unit group 134b are separately electrically insulated from the driving electrode unit 133.

The first sensing electrode unit group 134a may include at least one sensing electrode unit 134, the second sensing electrode unit group 134b may include at least one sensing electrode unit 134, and the at least one sensing electrode unit 134 in the first sensing electrode unit group 134a is spaced from and distributed opposite to the at least one sensing electrode unit 134 in the second sensing electrode unit group 134b in a first direction H1. In addition, each sensing electrode unit 134 in the first sensing electrode unit group 134a is connected to one sensing electrode unit 134 that is in the second sensing electrode unit group 134b and that is opposite to the sensing electrode unit 134 in the first sensing electrode unit group 134a in the first direction H1.

The first metal layer 124 is used as the driving electrode unit 133, and the second metal layer 125 is used as the sensing electrode unit 134.

Specifically, the first sensing electrode unit group 134a may include three spaced sensing electrode units 134 arranged in a second direction H2, the second sensing electrode unit group 134b may include three spaced sensing electrode units 134 arranged in the second direction H2, and the three sensing electrode units 134 in the first sensing electrode unit group 134a are spaced from and distributed opposite to the three sensing electrode units 134 in the second sensing electrode unit group 134b in the first direction H1. In addition, each sensing electrode unit 134 in the first sensing electrode unit group 134a is connected to one sensing electrode unit 134 that is in the second sensing electrode unit group 134b and that is opposite to the sensing electrode unit 134 in the first sensing electrode unit group 134a in the first direction H1.

When the first metal layer 124 is used as the driving electrode unit 133, and the second metal layer 125 is used as the sensing electrode unit 134, the driving electrode unit 133 is located at one layer, the first sensing electrode unit group 134a and the second sensing electrode unit group 134b are located at another layer, and the three sensing electrode units 134 in the first sensing electrode unit group 134a and the three sensing electrode units 134 in the second sensing electrode unit group 134b are in a one-to-one correspondence and are connected to each other. In this way, three subchannels can be formed between the first sensing electrode unit group 134a and the second sensing electrode unit group 134b, and the three subchannels are connected to a same signal source, to ensure that a receive end channel opposite to each driving electrode unit 133 is formed by three subchannels.

In addition, in this embodiment of this application, the sensing electrode unit 134 in each first sensing electrode unit group 134a is in direct electrical contact with the sensing electrode unit 134 in the second sensing electrode unit group 134b. Because the first notch 1221 does not need to be disposed on the second insulating layer 122 between the first metal layer 124 and the second metal layer 125 to implement a via hole connection, the first sensing electrode unit group 134a and the second sensing electrode unit group 134b can implement an electrical connection and signal conduction through direct electrical contact.

Figure 12:
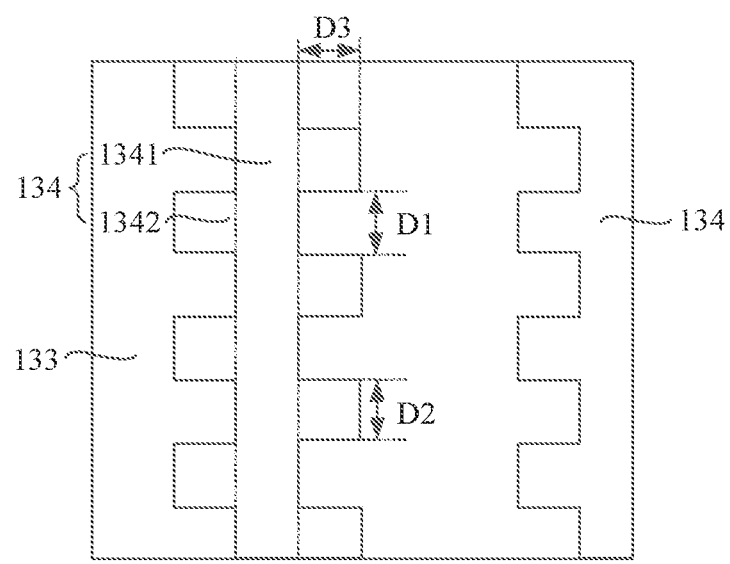

As shown in FIG. 12, each sensing electrode unit 134 may include a first body part 1341 and a plurality of first serrated parts 1342, where the plurality of first serrated parts 1342 are connected to the first body part 1341.

In addition, a spacing (namely, a first distance D1) between two adjacent first serrated parts 1342 located on a same side of the first body part 1341 may be more than four times a pixel pitch of light sources, a size (namely, a second distance D2) of each first serrated part 1342 in a length direction of the sensing electrode unit 134 may be more than four times the pixel pitch of the light sources, and a size (namely, a third distance D3) of each first serrated part 1342 in a width direction of the sensing electrode unit 134 may be more than four times the pixel pitch of the light sources.

The foregoing values are set to implement an effect of increasing a capacitance value, thereby further ensuring that a touch failure problem caused by a low temperature is improved, a signal quantity and signal uniformity are improved, and a linearity effect of an active pen is improved.

Figure 13:
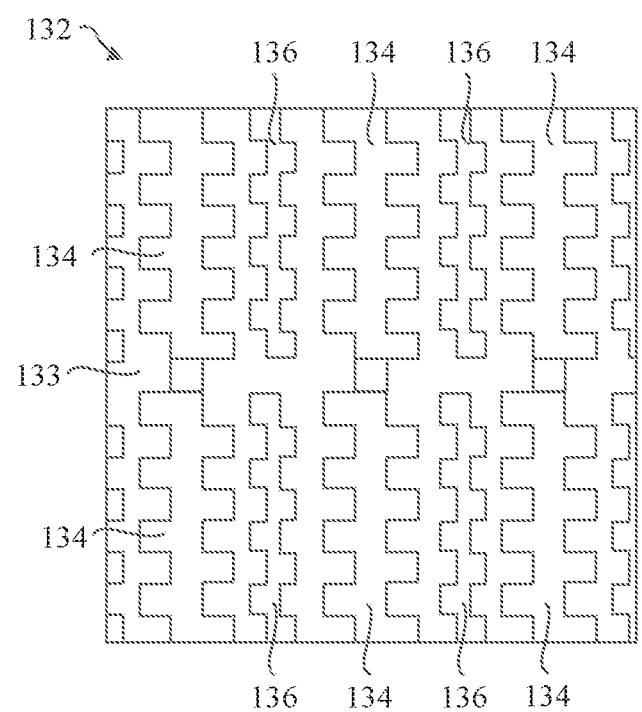
FIG. 13 is a schematic diagram of a structure of a single touch Pitch in a touch screen panel according to an embodiment of this application.
Figure 14:
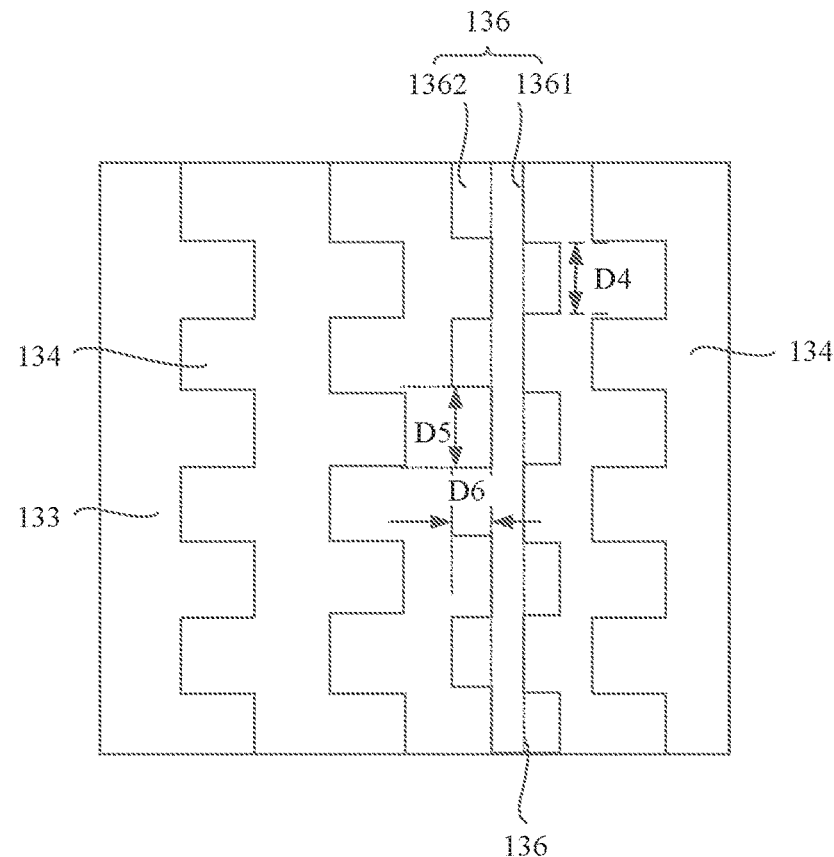

In addition, in some embodiments, refer to FIG. 13 and FIG. 14. The touch integrated circuit layer 120 may further have a plurality of second notches 136, and the second notch 136 is located between two adjacent sensing electrode units 134 in a same sensing electrode unit 134 group. The plurality of second notches 136 are disposed on the touch integrated circuit layer 120, the second notch 136 is located between two adjacent sensing electrode units 134 in the same sensing electrode unit 134 group, and the second notches 136 are used as virtual wires, and are used as floating lands (DUMMY) to implement signal-free, thereby implementing an effect of reducing a capacitance load and improving a low ground mass benefit.

For example, the second notch 136 may be serrated, and an extension direction of the second notch 136 may be the same as an extension direction of the sensing electrode unit 134. In this way, a relative area between the second notch 136 and the sensing electrode unit 134 can be increased, so that performance of the second notch 136 as the floating land can be ensured.

As shown in FIG. 14, each second notch 136 may include a second body part 1361 and a plurality of second serrated parts 1362, where the plurality of second serrated parts 1362 are connected to the second body part 1361.

In addition, a size (namely, a fourth distance D4) of each second serrated part 1362 in a length direction of the second notch 136 may be more than two times a pixel pitch of light sources, a spacing (namely, a fifth distance D5) between two adjacent second serrated parts 1362 located on a same side of the second body part 1361 may be more than two times the pixel pitch of the light sources, and a size (namely, a sixth distance D6) of each second serrated part 1362 in a width direction of the second notch 136 may be more than two times the pixel pitch of the light sources.

The foregoing values are set to further ensure the effect of reducing a capacitance load and improving a low ground mass benefit.

Figure 15:
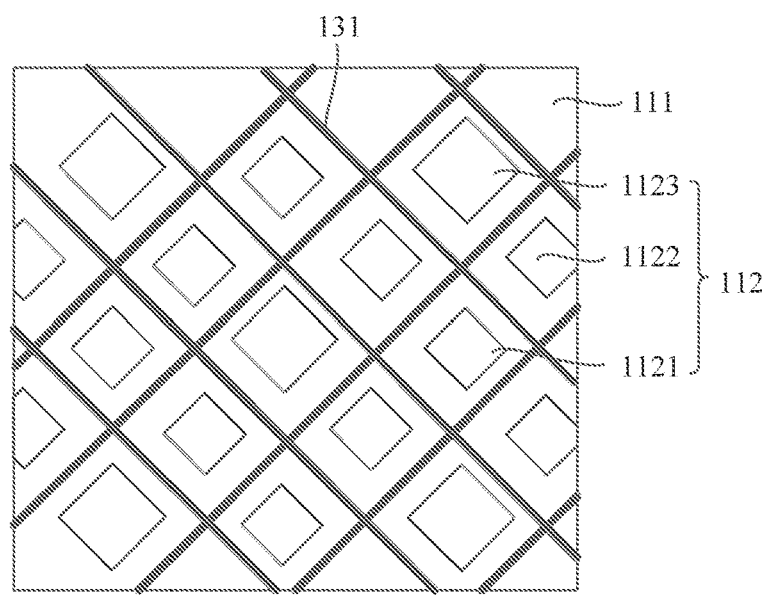
FIG. 15 is a schematic diagram of a microstructure at any point in FIG. 11.

In addition, as shown in FIG. 15, in this embodiment of this application, the substrate layer 110 may include a pixel definition layer 111 and a plurality of light sources, where the plurality of light sources are located on the pixel definition layer 111.

It may be understood that the light sources each may be a red light source 1121, a green light source 1122, or a blue light source 1123, and the red light source 1121, the green light source 1122, and the blue light source 1123 jointly form an RGB light source 112.

It should be noted that a pixel pitch L1 of the light sources is a spacing between two light sources of a same color. For example, in FIG. 15, the pixel pitch L1 of the light sources may be a spacing between two red light sources 1121.

The touch functional layer 130 may further include metal wires 131, and the metal wires 131 are distributed among the plurality of light sources to form metal grids, to isolate each light source from remaining light sources. In this way, it can be ensured that the metal wires 131 are designed at locations other than the light sources on the pixel definition layer 111, and the metal wires 131 are connected to each other to form the metal grids, to avoid interference between the metal wires 131 and the light sources.

In addition, in this embodiment of this application, a thickness of each of the first insulating layer 121, the second insulating layer 122, and the overlay layer 123 may be 1.5 µm~3 µm. For example, the thickness of each of the first insulating layer 121, the second insulating layer 122, and the overlay layer 123 may be 1.5 µm, 1.8 µm, 2.0 µm, 2.5 µm, 2.8 µm, or 3 µm. This is not limited in this embodiment of this application.

It should be noted herein that a value and a value range in this application are approximate values, and an error in a specific range may exist due to an impact of a manufacturing process. A person skilled in the art may ignore the error.

Other technical features are the same as those in Embodiment 1, and a same technical effect can be achieved. Details are not described herein again.

In the descriptions of the embodiments of this application, it should be noted that unless otherwise specified or limited, terms "mount", "communicate", and "connect" shall be understood in a broad sense, for example, may be a fixed connection, may be an indirect connection by using an intermediate medium, or may be a connection between insides of two elements or an interaction relationship between two elements. A person of ordinary skill in the art may understand specific meanings of the foregoing terms in the embodiments of this application based on a specific situation.

The apparatus or element referred to in or implied in embodiments of this application needs to have a specific orientation, be constructed and operated in a specific orientation, and therefore cannot be construed as a limitation on embodiments of this specification. In the descriptions of embodiments of this application, "a plurality of" means two or more, unless otherwise specifically specified.

The terms "first", "second", "third", "fourth", and the like (if any) in this specification, the claims, and the accompanying drawings of the embodiments of this application are used to distinguish between similar objects without having to describe a specific order or sequence. It should be understood that the data used in such a way is interchangeable in proper situations, so that the embodiments of the embodiments of this application described herein can be implemented, for example, in orders other than those illustrated or described herein. In addition, the terms "may include", "have", and any variation thereof are intended to cover non-exclusive inclusions. For example, a process, a method, a system, a product, or a device that includes a series of steps or units is not necessarily limited to those steps or units that are clearly listed, but may include other steps or units that are not clearly listed or are inherent to the process, method, product, or device.

Finally, it should be noted that the foregoing embodiments are merely used to describe but not limit the technical solutions of the embodiments of this application. Although the embodiments of this application are described in detail with reference to the foregoing embodiments, it should be understood by a person of ordinary skill in the art that the technical solutions described in the foregoing embodiments may still be modified, or some or all technical features thereof may be equivalently replaced. These modifications or replacements do not make the essence of the corresponding technical solutions depart from the scope of the technical solutions of the embodiments of this application.

What is claimed is:

1. A touch screen panel, comprising:
   a substrate layer; and
   a touch integrated circuit layer located above the substrate layer,
   wherein the touch integrated circuit layer comprises a first insulating layer, a first metal layer, a second insulating layer, a second metal layer, and an overlay layer that are stacked;
   wherein the first metal layer is located between the first insulating layer and the second insulating layer, the second metal layer is located between the second insulating layer and the overlay layer, and the first insulating layer is located between the substrate layer and the first metal layer;
   wherein the first metal layer and the second metal layer jointly form a touch functional layer, the touch functional layer comprises at least one driving electrode and a plurality of sensing electrodes, the at least one driving electrode is electrically insulated from the plurality of sensing electrodes, and each sensing electrode is serrated;
   wherein the substrate layer comprises a pixel definition layer and a plurality of light sources located on the pixel definition layer;
   wherein the touch functional layer further comprises metal wires, and the metal wires are distributed among the plurality of light sources to form metal grids, to isolate each light source from remaining light sources in the plurality of light sources; and
   wherein a first notch is disposed on the second insulating layer, and the first metal layer and the second metal layer are connected through the first notch.

2. The touch screen panel according to claim 1,
   wherein a partial area of the overlay layer extends toward an inside of the second metal layer to form an insulating extension layer; and
   wherein a projection area of the insulating extension layer on the first metal layer is located in a projection area of the first notch on the first metal layer.

3. The touch screen panel according to claim 1,
   wherein materials used for the first insulating layer and the second insulating layer are organic materials; or
   wherein materials used for the first insulating layer and the second insulating layer are inorganic materials.

4. The touch screen panel according to claim 1,
   wherein the second metal layer comprises a plurality of touch pixels;
   wherein each touch pixel of the plurality of touch pixels comprises the driving electrode, and a first sensing electrode group and a second sensing electrode group that are separately electrically insulated from the driving electrode;
   wherein the first sensing electrode group comprises at least one sensing electrode, the second sensing electrode group comprises at least one sensing electrode, and the at least one sensing electrode in the first sensing electrode group is spaced from and distributed opposite to the at least one sensing electrode in the second sensing electrode group in a first direction; and wherein each sensing electrode in the first sensing electrode group is connected to one sensing electrode that is in the first sensing electrode group and that is opposite to the sensing electrode in the first sensing electrode group in the first direction.

5. The touch screen panel according to claim 4, wherein the first sensing electrode group comprises three spaced sensing electrodes arranged in a second direction, the second sensing electrode group comprises three spaced sensing electrodes arranged in the second direction, and the three sensing electrodes in the first sensing electrode group are spaced from and distributed opposite to the three sensing electrodes in the second sensing electrode group in the first direction;

wherein each sensing electrode in the first sensing electrode group is connected to one sensing electrode that is in the first sensing electrode group and that is opposite to the sensing electrode in the first sensing electrode group in the first direction; and wherein the second direction is perpendicular to the first direction.

6. The touch screen panel according to claim 4, wherein the touch functional layer further comprises a plurality of bridges, the sensing electrode in each first sensing electrode group is electrically connected to the sensing electrode in the second sensing electrode group by using a bridge from the plurality of bridges; and wherein the first metal layer is used as the bridge.

7. The touch screen panel according to claim 6, wherein the sensing electrode in each first sensing electrode group is electrically connected to the sensing electrode in the second sensing electrode group by using two bridges.

8. The touch screen panel according to claim 4, wherein the touch integrated circuit layer further has a plurality of second notches, and each second notch of the plurality of second notches is located between two adjacent sensing electrodes in a same sensing electrode group.

9. The touch screen panel according to claim 8, wherein the second notch is serrated, and an extension direction of each second notch of the plurality of second notches is the same as an extension direction of the sensing electrode.

10. The touch screen panel according to claim 9, wherein each second notch of the plurality of second notches comprises a second body part and a plurality of second serrated parts connected to the second body part;

wherein a size of each second serrated part in a length direction of each second notch is more than two times a pixel pitch of the plurality of light sources;

wherein a size of each second serrated part in a width direction of each second notch is more than two times the pixel pitch of the plurality of light sources; and wherein a spacing between two adjacent second serrated parts located on a same side of the second body part is more than two times the pixel pitch of the plurality of light sources.

11. The touch screen panel according to claim 1, wherein materials used for the first insulating layer and the second insulating layer are organic materials.

12. The touch screen panel according to claim 11, wherein the touch functional layer comprises a plurality of touch pixels;

wherein each touch pixel comprises the driving electrode, and a first sensing electrode group and a second sensing electrode group that are separately electrically insulated from the driving electrode;

wherein the first sensing electrode group comprises at least one sensing electrode, the second sensing electrode group comprises at least one sensing electrode, and the at least one sensing electrode in the first sensing electrode group is spaced from and distributed opposite to the at least one sensing electrode in the second sensing electrode group in a first direction; and wherein each sensing electrode in the first sensing electrode group is connected to one sensing electrode that is in the first sensing electrode group and that is opposite to the sensing electrode in the first sensing electrode group in the first direction; and wherein the first metal layer is used as the driving electrode, and the second metal layer is used as the sensing electrode.

13. The touch screen panel according to claim 12, wherein the first sensing electrode group comprises three spaced sensing electrodes arranged in a second direction, the second sensing electrode group comprises three spaced sensing electrodes arranged in the second direction, and the three sensing electrodes in the first sensing electrode group are spaced from and distributed opposite to the three sensing electrodes in the second sensing electrode group in the first direction;

wherein each sensing electrode in the first sensing electrode group is connected to one sensing electrode that is in the first sensing electrode group and that is opposite to the sensing electrode in the first sensing electrode group in the first direction; and wherein the second direction is perpendicular to the first direction.

14. The touch screen panel according to claim 12, wherein the sensing electrode in each first sensing electrode group is in direct electrical contact with the sensing electrode in the second sensing electrode group.

15. The touch screen panel according to claim 1, wherein each sensing electrode comprises a first body part and a plurality of first serrated parts connected to the first body part;

wherein a size of each first serrated part in a length direction of the sensing electrode is more than four times a pixel pitch of the plurality of light sources;

wherein a size of each first serrated part in a width direction of the sensing electrode is more than four times the pixel pitch of the plurality of light sources; and wherein a spacing between two adjacent first serrated parts located on a same side of the first body part is more than four times the pixel pitch of the plurality of light sources.

16. The touch screen panel according to claim 1, wherein the overlay layer is an organic overlay layer.

17. The touch screen panel according to claim 1, wherein the touch screen panel further comprises a thin film encapsulation layer, and the thin film encapsulation layer is located between the substrate layer and the touch integrated circuit layer.

18. An electronic device, comprising:

a touch screen panel, comprising:

a substrate layer; and a touch integrated circuit layer located above the substrate layer;

wherein the touch integrated circuit layer comprises a first insulating layer, a first metal layer, a second insulating layer, a second metal layer, and an overlay layer that are stacked;

wherein the first metal layer is located between the first insulating layer and the second insulating layer, the second metal layer is located between the second insulating layer and the overlay layer, and the first insulating layer is located between the substrate layer and the first metal layer;

wherein the first metal layer and the second metal layer jointly form a touch functional layer, the touch functional layer comprises at least one driving electrode and a plurality of sensing electrodes, the at least one driving electrode is electrically insulated from the plurality of sensing electrodes, and each sensing electrode is serrated;

wherein the substrate layer comprises a pixel definition layer and a plurality of light sources located on the pixel definition layer;

wherein the touch functional layer further comprises metal wires, and the metal wires are distributed among the plurality of light sources to form metal grids, to isolate each light source from remaining light sources in the plurality of light sources; and wherein a first notch is disposed on the second insulating layer, and the first metal layer and the second metal layer are connected through the first notch.

19. The electronic device according to claim 18,
wherein a partial area of the overlay layer extends toward an inside of the second metal layer to form an insulating extension layer; and wherein a projection area of the insulating extension layer on the first metal layer is located in a projection area of the first notch on the first metal layer.

20. The electronic device according to claim 18,
wherein materials used for the first insulating layer and the second insulating layer are organic materials; or wherein materials used for the first insulating layer and the second insulating layer are inorganic materials.

* * * * *